(12) United States Patent
Jur et al.

(10) Patent No.: US 10,483,448 B2
(45) Date of Patent: Nov. 19, 2019

(54) FLEXIBLE THERMOELECTRIC DEVICES, METHODS OF PREPARATION THEREOF, AND METHODS OF RECOVERING WASTE HEAT THEREWITH

(71) Applicants: North Carolina State University, Raleigh, NC (US); University of Virginia Patent Foundation, Charlottesville, VA (US)

(72) Inventors: Jesse Jur, Raleigh, NC (US); Mark Losego, Durham, NC (US); Patrick E. Hopkins, Charlottesville, VA (US)

(73) Assignees: North Carolina State University, Raleigh, NC (US); University of Virginia Patent Foundation, Charlottesville, VA (US)

( * ) Notice: Subject to any disclaimer, the term of this patent is extended or adjusted under 35 U.S.C. 154(b) by 0 days.

(21) Appl. No.: 15/890,748

(22) Filed: Feb. 7, 2018

(65) Prior Publication Data

US 2018/0212133 A1 Jul. 26, 2018

Related U.S. Application Data

(63) Continuation of application No. 14/694,171, filed on Apr. 23, 2015, now Pat. No. 9,929,332.

(60) Provisional application No. 61/984,373, filed on Apr. 25, 2014.

(51) Int. Cl.
*H01L 35/32* (2006.01)
*H01L 35/34* (2006.01)

(52) U.S. Cl.
CPC .............. *H01L 35/32* (2013.01); *H01L 35/34* (2013.01)

(58) Field of Classification Search
None
See application file for complete search history.

(56) References Cited

U.S. PATENT DOCUMENTS

| 3,019,278 A | 1/1962 | Fischer |
| 4,276,441 A | 6/1981 | Wilson |
| 4,343,960 A | 8/1982 | Eguchi et al. |
| 4,463,214 A * | 7/1984 | Lowther ................. H01L 35/32 136/201 |
| 4,946,511 A | 8/1990 | Shiloh et al. |
| 5,757,125 A * | 5/1998 | Furlong ................. H05B 33/06 313/503 |

(Continued)

OTHER PUBLICATIONS

Yamamoto et al. "Electrical Power Generation from a Knitted Wire Panel Using the Thermoelectric Effect," *Electrical Engineering in Japan*, 2002, vol. 140, No. 1, pp. 1011-1016.

*Primary Examiner* — Eli S Mekhlin
(74) *Attorney, Agent, or Firm* — Womble Bond Dickinson (US) LLP

(57) ABSTRACT

The present disclosure relates to flexible thermoelectric devices. In some embodiments, such devices can comprise a flexible substrate with a first conductive component and a second, different conductive component deposited thereon so as to form a plurality of electrical junctions. The flexible substrate can be a fabric, and the conductive component can be deposited by methods such as stitching of conductive yarns or deposition of conductive inks. The present disclosure further relates to methods of preparing flexible thermoelectric devices and methods of utilizing flexible thermoelectric devices for producing electrical current from waste heat.

16 Claims, 5 Drawing Sheets

(56) References Cited

U.S. PATENT DOCUMENTS

| | | | |
|---|---|---|---|
| 6,415,501 B1 | 7/2002 | Schlesselman et al. | |
| 6,872,879 B1 | 3/2005 | Serras et al. | |
| 7,494,945 B2 | 2/2009 | Moreshead | |
| 8,383,926 B2 | 2/2013 | Plissonnier et al. | |
| 2003/0084935 A1* | 5/2003 | Bell | H01L 35/32 136/200 |
| 2004/0025930 A1* | 2/2004 | Serras | G01K 7/02 136/200 |
| 2008/0029146 A1 | 2/2008 | Plissonnier et al. | |
| 2008/0044634 A1* | 2/2008 | Enciu | H05K 3/12 428/209 |
| 2009/0133734 A1 | 5/2009 | Takahashi | |
| 2009/0243078 A1 | 10/2009 | Lim et al. | |
| 2011/0032969 A1* | 2/2011 | Warren | F24J 3/08 374/121 |
| 2012/0247524 A1 | 10/2012 | Rolison | |

* cited by examiner

FIG. 2 (a)
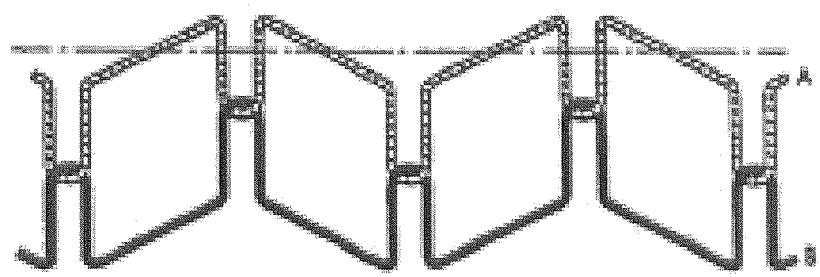
FIG. 2 (b)
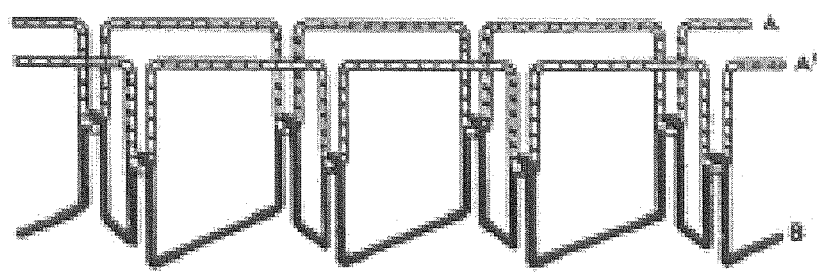
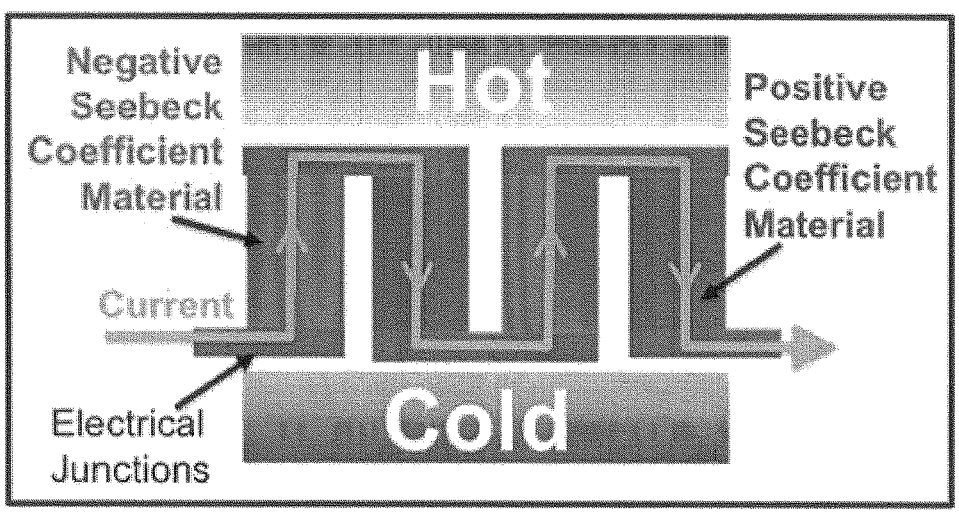
FIG. 3

FIG. 4 (a)
Steam Turbine
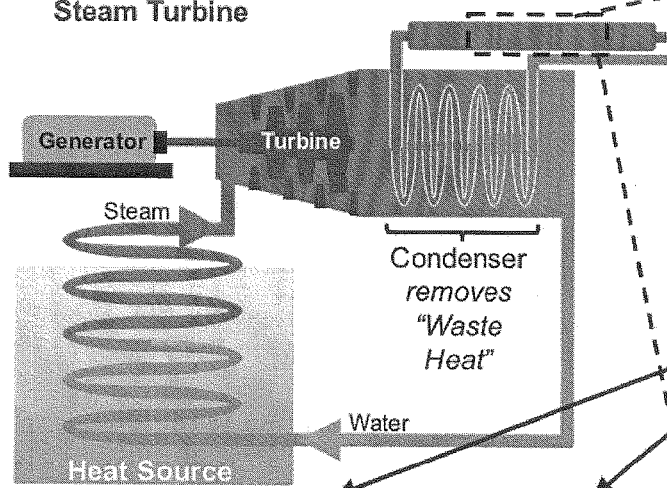
FIG. 4 (b)
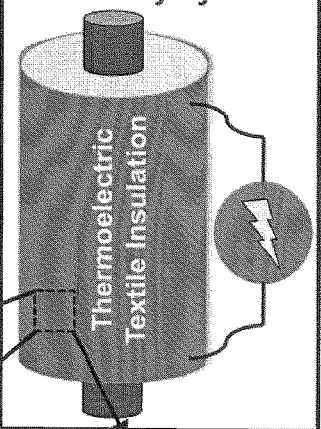
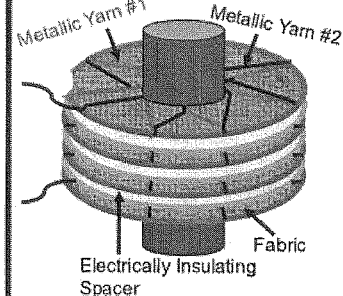
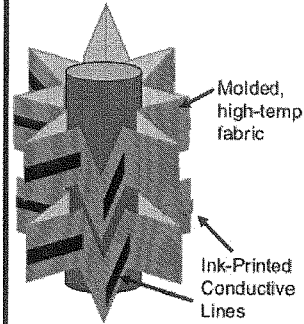
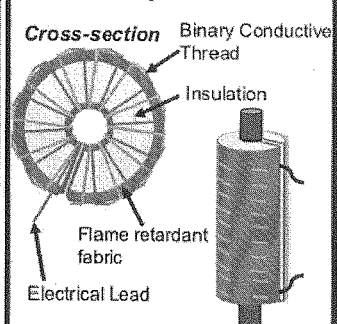
FIG. 4 (c)  FIG. 4 (d)  FIG. 4 (e)

US 10,483,448 B2

FLEXIBLE THERMOELECTRIC DEVICES, METHODS OF PREPARATION THEREOF, AND METHODS OF RECOVERING WASTE HEAT THEREWITH

CROSS-REFERENCE TO RELATED APPLICATIONS

The present application is a continuation of U.S. application Ser. No. 14/694,171 filed Apr. 23, 2015, now U.S. Pat. No. 9,929,332, and claims priority to U.S. Provisional Application No. 61/984,373, filed Apr. 25, 2014, the disclosures of which are incorporated by reference herein.

FIELD OF THE DISCLOSURE

The present disclosure relates to flexible platforms for heat recovery, and particularly relates to flexible thermoelectric devices and methods of manufacture thereof.

BACKGROUND

Many processes, industrial and biological, produce waste heat. Waste heat recovery methods previously implemented by various industries have included heat-to-heat technologies that transfer heat from unwanted places to processes or locations where thermal input is needed and heat-to-power technologies that convert heat to energy (e.g., electricity).

Heat-to-heat technologies include heat exchangers and preheaters, and such technologies are commonly implemented in high temperature (e.g., >650° C.) processes, such as melting furnaces and incinerators, to transfer exhausted heat to other fluid streams. As temperature decreases, however, heat transfer kinetics slow, and larger surface areas are required to maintain efficiency. Low temperature heat flows are also often not useful for industrial processes, necessitating an upgrade using additional equipment such as a heat pump. As a result, heat exchanger technology is uncommon for heat streams of <150° C.

At more moderate temperatures (e.g., 250° C. to 650° C.), heat-to-power technologies can be used, such as in systems implementing Rankine power cycles. Steam turbines are common examples of such technology, and typical steam turbines using water as the working fluid can only operate efficiently above about 350° C. Although organic Rankine cycles (using a lower boiling organic material with as the working fluid) can achieve efficiencies of 10-20% below 250° C., specific optimization is typically required, and the organic working fluid raises toxicity, flammability, explosivity, and environmental concerns.

Relatively few options are presently known for recovering low temperature (e.g., <250° C.) waste heat. Examples of known sources of low temperature waste heat (and the typical temperature range of the waste heat) include steam boiler exhaust (150-260° C.), exhaust gas from recovery devices (70-250° C.), process steam condensates (50-90° C.), cooling water return (30-250° C.), and drying/baking ovens (90-250° C.). Computing data centers are further sources of low temperature waste heat, and for example, exhaust air from data racks can produce fluid temperatures of about 50-100° C. above ambient. Although microscale devices (e.g., thin film thermoelectric modules) have shown promise at the microchip level, no effective macroscale solution is presently known. There remains a need in the art for further options for recovery of low temperature waste heat.

SUMMARY OF THE DISCLOSURE

The present disclosure relates to thermoelectric (TE) devices. The disclosure particular provides flexible platforms for TE devices that enable the devices to partially or substantially conform to the shape of a heat source around which the flexible TE device may be partially or completely wrapped.

In some embodiments, flexible thermoelectric devices according to the present disclosure can comprise a flexible substrate with a first conductive component and a second, different conductive component deposited thereon so as to form a plurality of electrical junctions. In further embodiments, a flexible thermoelectric device according to the present disclosure can be defined by one or more of the following statements. It is understood that any combination of the following statements is encompassed by the present disclosure.

The flexible substrate can define a first surface spaced apart from a second surface, and the plurality of electrical junctions can be positioned at the respective surfaces in an alternating fashion.

The electrical junctions positioned at the first surface can be separated from the junctions positioned at the second surface with an electrically insulating medium.

The plurality of electrical junctions can define a plurality of thermopiles.

The flexible substrate can be formed of a fibrous material.

The flexible substrate can be a woven fabric or a non-woven fabric.

The flexible substrate can be a polymeric film.

The flexible substrate can be formed of a natural or synthetic material.

The flexible substrate can comprise a material selected from the group consisting of polyesters, cotton, polyamides, poly-N-vinylcarbazole, cellulosic materials, polyvinyl alcohol, polypropylene, polyethylene terephthalate, fiberglass, and combinations thereof.

The substrate can be one or both of molded and folded.

The substrate can include one or more cuts or perforations.

One or both of the first conductive component and the second conductive component can be a conductive thread or yarn.

One or both of the first conductive component and the second conductive component can be a conductive ink.

One or both of the first conductive component and the second conductive component can comprise conductive particles and a carrier.

The first conductive component can have a positive or negative Seebeck coefficient and the second conductive component can have a Seebeck coefficient of opposing sign.

The first conductive component and the second conductive component can have respective Seebeck coefficients that differ by at least 25, by at least 50, by at least 75, or by at least 100.

In further embodiments, the present disclosure further relates to methods of forming a thermoelectric device. The formed TE device can be defined by any of the statements above in any combination and/or any further disclosure provided herein. In exemplary embodiments, methods of forming a flexible TE device can comprise depositing a first conductive component and a second, different conductive component on a flexible substrate so as to form a plurality of electrical junctions. In further embodiments, methods of forming flexible TE device according to the present disclosure can be defined by one or more of the following statements. It is understood that any combination of the following statements is encompassed by the present disclosure.

The flexible substrate can define a first surface spaced apart from a second surface, and the first and second conductive components can be deposited such that the plurality of electrical junctions are positioned at the respective surfaces in an alternating fashion.

The method can comprise one or both of molding and folding the flexible substrate one or both of before and after depositing the first and second conductive components.

Depositing one or both of the first and second conductive components can comprise stitching a conductive thread or yarn to the flexible substrate.

Depositing one or both of the first and second conductive components can comprise applying a conductive ink to the flexible substrate.

In other embodiments, the present disclosure relates to methods of producing electrical current from waste heat. Such methods can comprise applying a flexible thermoelectric device as otherwise described herein to a source of waste heat. In particular, the methods can comprise partially or substantially conforming the flexible thermoelectric device to the source of waste heat. For example, the flexible thermoelectric device can be conformed to curved surfaces or cylindrical surfaces, as well as being conformed to substantially planar surfaces, which may include one or more non-planar portions.

The foregoing provides a summary of the present disclosure and is not to be considered limiting of the various further embodiments that may be encompassed by the further disclosure provided herein. The nature of the flexible TE devices, methods of preparation of such devices, and methods of using such devices should thus be construed in light of the entirety of the present disclosure with reference to the non-limiting embodiments and examples provided herein.

BRIEF DESCRIPTION OF THE FIGURES

Figure 1:
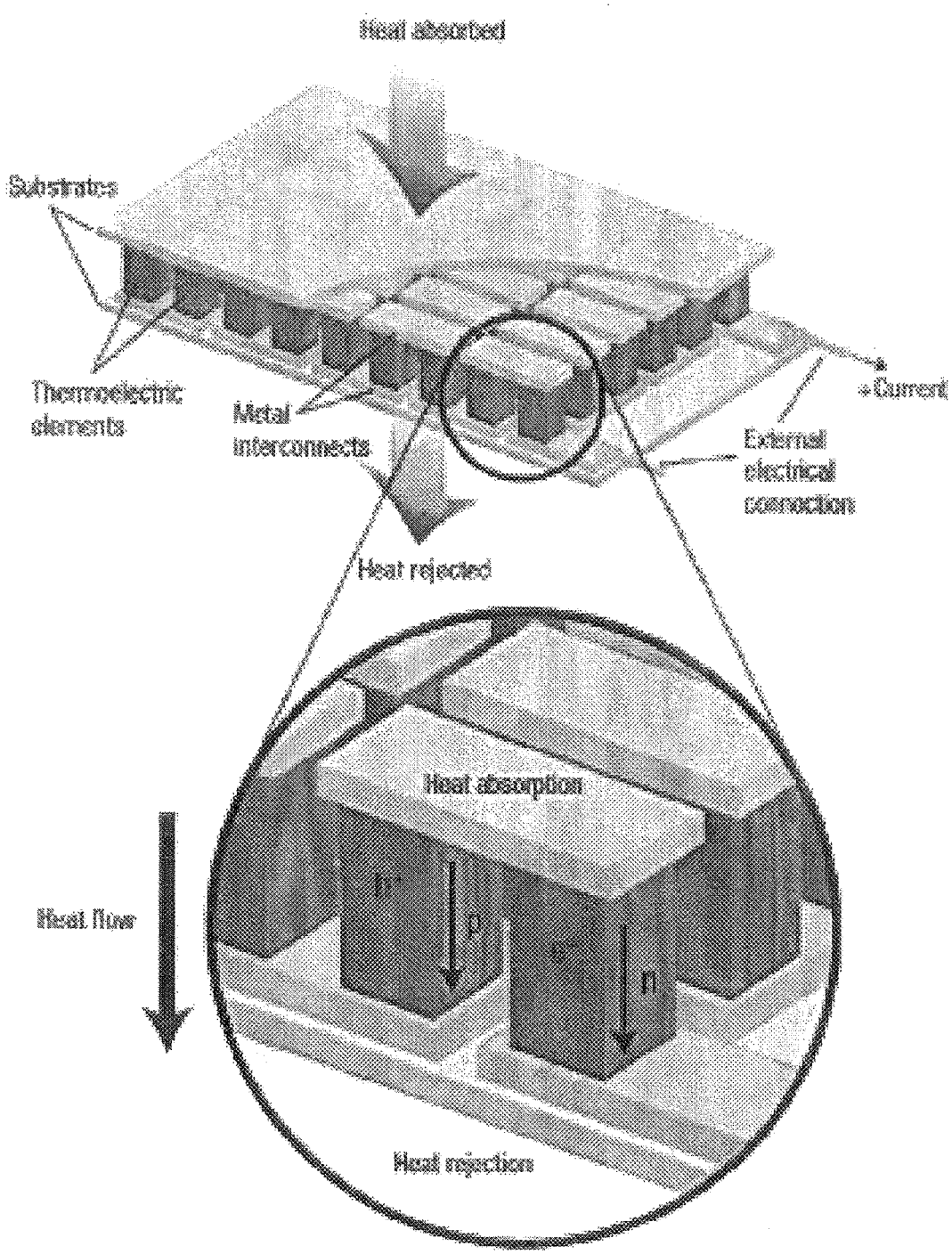
Figure 5:
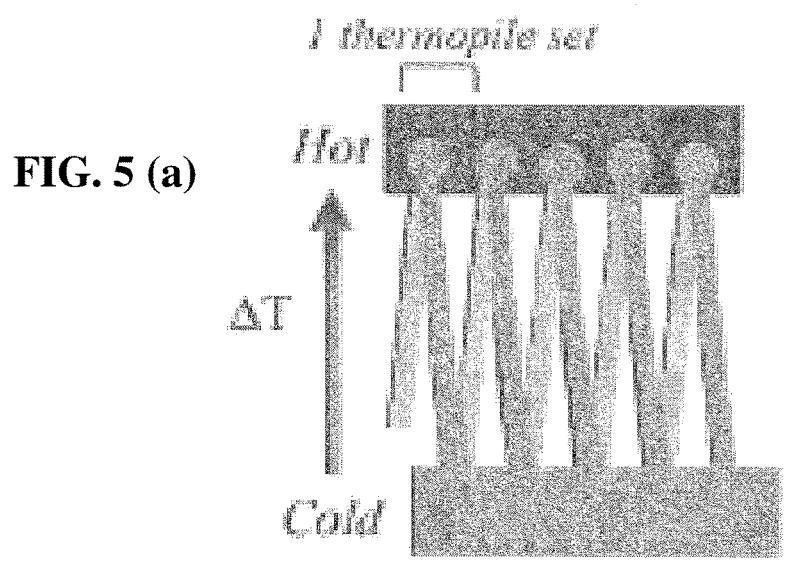
Figure 5:
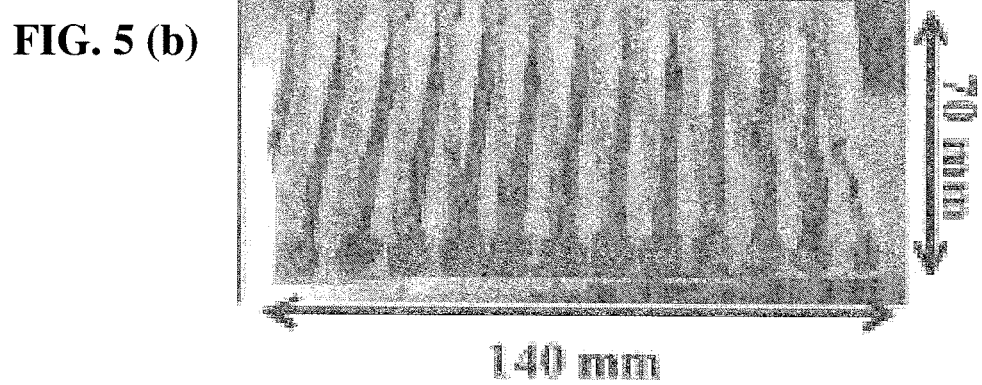
Figure 6:
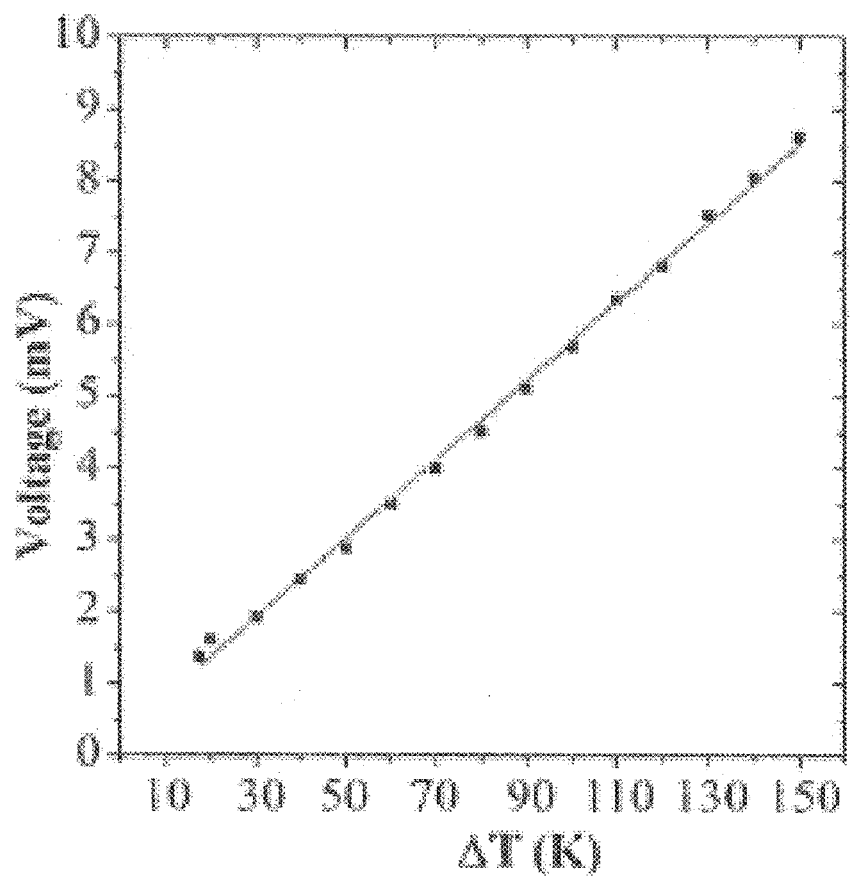

Having thus described the disclosure in the foregoing Summary, reference will now be made to the accompanying drawings, which are not necessarily drawn to scale, and wherein:

FIG. 1 is an illustration of a thermoelectric module showing an exemplary combination of a plurality of TE elements of opposite sign in electrical series and thermally in parallel;

FIG. 2a is an illustration of an exemplary stitching type that may be used in forming a flexible TE device according to an embodiment of the present disclosure;

FIG. 2b is an illustration of another exemplary stitching type that may be used in forming a flexible TE device according to an embodiment of the present disclosure;

FIG. 3 is an illustration of alternating junctions of positive and negative Seebeck coefficient connected electrically in series and thermally in parallel for generation of electrical current from a temperature differential according to an exemplary embodiment of the present disclosure;

FIG. 4a is an illustration of a flexible TE device according to the present disclosure utilized in waste heat recovery in an exemplary steam turbine design;

FIG. 4b is an exploded view of the flexible TE device shown in FIG. 4a;

FIG. 4c is an illustration of an exemplary structure of a flexible TE device according to the present disclosure showing the combination of the flexible substrate and the first electrically conductive component and the second electrically conductive material, wherein the electrically conductive components comprise first and second metallic yarns stitched into the flexible substrate;

FIG. 4d is an illustration of another exemplary structure of a flexible TE device according to the present disclosure showing the combination of the flexible substrate and the first electrically conductive component and the second electrically conductive material, wherein the electrically conductive components comprise first and second conductive inks deposited onto the flexible substrate;

FIG. 4e is an illustration of a further exemplary structure of a flexible TE device according to the present disclosure showing the combination of the flexible substrate and the first electrically conductive component and the second electrically conductive material, wherein the electrically conductive components are present in a binary conductive thread stitched into the flexible substrate;

FIG. 5a is an illustration of design for an exemplary thermopile construction in a flexible TE device according to the present disclosure;

FIG. 5b is an image of a flexible TE device according to an exemplary embodiment of the present disclosure wherein 12 thermopiles (24 junctions) are present in a zigzag pattern on a nonwoven nylon substrate, the thermopiles being formed from a first ink comprising nickel particles and a second ink comprising silver coated copper particles; and FIG. 6 is a graph showing the potential formed on the orthogonal sides of the flexible TE device illustrated in FIG. 5b while one side of the device was heated and the opposing side was maintained in an ice bath, wherein the potential measurement was made with increasing temperature from the 0° C. reference.

DETAILED DESCRIPTION

The present disclosure will now be described more fully hereinafter with reference to exemplary embodiments thereof. These exemplary embodiments are described so that this disclosure will be thorough and complete, and will fully convey the scope of the disclosure to those skilled in the art. Indeed, the disclosure may be embodied in many different forms and should not be construed as limited to the embodiments set forth herein; rather, these embodiments are provided so that this disclosure will satisfy applicable legal requirements. As used in the specification, and in the appended claims, the singular forms "a", "an", "the", include plural referents unless the context clearly dictates otherwise.

Thermoelectrics (TE) are solid state devices that utilize the thermoelectric effect for the direct conversion of thermal energy (i.e., temperature differences) to electricity. As such, a thermoelectric can create voltage when there is a temperature differential across the device. Thermoelectrics thus utilize the Seebeck effect, and the figure of merit for a TE is described by the value ZT according to Equation 1 below.

$$ZT = \frac{S^2 \sigma T}{\Lambda} \qquad \text{Equation 1}$$

In Equation 1, S is the Seebeck coefficient, σ is electrical conductivity, Λ is the thermal conductivity, and T is temperature. High ZT values indicate higher efficiencies. Thus, good TE materials have a high Seebeck coefficient and electrical conductivity but are thermal insulators. Because electronic conductivity contributes to thermal conductivity, semiconductors are typically thought of as being good TE materials. TE device structures are typically designed using two TE materials of opposite Seebeck coefficients connected electrically in series and thermally in parallel. Such structure is illustrated in FIG. 1. Common arrangements use junctions of n- and p-type semiconductors.

Known thermoelectrics include rigid semiconductor modules that are typically complex and expensive to manufacture, such as TEs based upon PbTe and SiGe. Such devices have been used extensively in power generation applications on space crafts showing potential for exhaust recovery over temperature ranges of 300-600° C. and 500-1000° C., respectively. Efficiencies for such known TE devices are generally low (e.g., approximately 8% or less at a temperature differential of 250° C.), and such efficiencies are further sharply reduced as the temperature differential is lowered.

Thin film TE modules have previously been manufactured using standard microelectronics technology but are limited to low power applications since TE modules must maintain a sizable temperature gradient to operate at high efficiencies regardless of the ZT value. For example, a thin film superlattice with a ZT value of approximately 2.4 (at 300 K) and a thermal conductivity of ~0.002 W cm$^{-1}$ K$^{-1}$ as reported by Venkatasubramian (Nature, 413, 2001), in light of Fourier's Law, must be at least 5 mm thick to maintain the 250° C. temperature difference necessary to reach the 1 W/cm$^2$ output of a typical bulk $Bi_2Te_3$ based TE devices. The described superlattices, however, were approximately 5 μm in thickness, or approximately three orders of magnitude smaller than that required as calculated above. Nanostructuring also has been examined as a tool to reduce a material's thermal conductivity and increase its ZT value; however, costly materials and expensive epitaxial growth methods that are required to produce such materials have prevented significant development of such technology.

According to the present disclosure, it has been discovered that thermoelectric devices suitable for low temperature waste heat recovery can be provided in a flexible platform that overcomes problems in the known field. In various aspects, the present disclosure relates to flexible thermoelectric devices that can be prepared by patterning electrically conductive junctions on a flexible substrate, such as a textile. The use of a flexible substrate makes the flexible TE suitable for integration with a heat source in a manner whereby it is closely configured to the shape and contours of the heat source. Thermal differences between junctions facing the heat source and the contact and junction facing the lower temperature condition (e.g., atmospheric conditions) results in the formation of usable energy driven by the thermoelectric effect.

Any flexible material may be utilized as a substrate for a TE device according to the present disclosure. A flexible material can be any material with sufficient flexibility to allow for bending of the finished TE device. In some embodiments, a flexible substrate can be sufficiently flexible to form a bend of at least 10 degrees, a bend of at least 30 degrees, a bend of at least 45 degrees, a bend of at least 70 degrees, or a bend of at least 90 degrees. Such flexibility likewise can apply to the finished flexible TE device. The flexible substrate and/or the flexible TE device may be elastic and/or may exhibit shape memory so that after partially or substantially conforming to a specific shape, the flexible substrate or device substantially maintains the specific shape permanently or until otherwise re-shaped. The flexible substrate and/or the TE device may partially or substantially conform naturally (i.e., without added assistance) or may partially or substantially conform upon application of pressure or the like to the substrate. The flexible TE device, for example can exhibit sufficient mechanical flexibility for partially or substantially conformal wrapping over non-planar surfaces and thus improve thermal contact between the flexible TE device and the covered surface.

In some embodiments textiles can be particularly advantageous in light of the high throughput manufacturing that is available. Textiles can be advantageous substrates in light of their insulating properties. Any flexible material (particularly any textile) that does not melt or degrade at temperatures up to about 350° C., up to about 300° C., or up to about 250° C. may be useful according to the present disclosure. Non-limiting examples of materials that may be used in a TE device substrate include polyesters, cotton, polyamides, poly-N-vinylcarbazole, cellulosic materials (e.g., cellulose triacetate), polyvinyl alcohol, polypropylene, polyethylene terephthalate, and fiberglass.

The flexible substrate can vary in thickness. For example, in some embodiments, a flexible substrate can have a thickness of greater than 1 cm, greater than 2.5 cm, greater than 5 cm, or greater than 10 cm. The flexible substrate can be substantially continuous or can be comprised of a plurality of substrates that are one or both of electrically and physically combined. The flexible substrate can be textured and/or contoured. For example, the flexible substrate can be molded or pleated, and specific curves or pleats may be configured in relation to the position of one or more thermopile junctions on the substrate. Texturing and/or contouring of the flexible substrate can be useful to provide for placement of hot and cold junctions spaced apart with air functioning as an insulation barrier between the junctions. The flexible substrate can be substantially impermeable, can have a defined porosity, or can comprise one or more openings therethrough. The flexible substrate can be formed of a single layer or a plurality of layers of the same material or different materials.

The flexible substrate can comprise one or more surface finishes. In some embodiments, a coating may be applied to the flexible substrate before or after application of the electrically conductive components. For example, a flexible TE device can include an epoxy finish or the like to substantially encase the device.

In some embodiments, a flexible TE according to the present disclosure can comprise a thermopile configuration based on the thermoelectric voltage between two electrically conductive materials with opposite Seebeck coefficients. For example, the thermopile can comprise a plurality of thermocouples connected in series or in parallel. The thermopile configuration can be particularly useful for incorporation with a flexible substrate, such as a textile, because of the ease of combination of the technologies. In some embodiments, the thermopile can be formed on a surface of a flexible substrate. For example, the thermopile can be applied to the substrate via conductive ink printing or by otherwise affixing an electrically conductive material to the substrate. In other embodiments, the thermopile can be formed simultaneously with the flexible substrate. For example, electrically conductive filaments or yarns can be woven into a textile or can be included in the formation of a nonwoven substrate. In some embodiments, embroidery can be used to combine an electrically conductive material with the flexible substrate. Electrically conductive filaments and/or yarns can be formed in some embodiments by electrodeposition of thin film coatings In some embodiments, stitching can be used to deposit an electrically conductive component on a flexible substrate.

Stitching is intended to encompass sewing, embroidering, and all other types of needle work whereby a thread or yarn is combined with a substrate. A stitch pattern can be configured to achieve low line resistance on a substrate. Close and overlapping stitch patterns can be useful to increase the conductor content per given length, resulting in a corresponding decrease in resistance. Non-limiting examples of stitching types that are suited for formation of thermopile junctions using yarns of materials of two dissimilar conductors (e.g., metals) include those described in ASTM D6193-97, such stitch types 304 and 312 shown in FIGS. 2a and 2b, respectively. Stitching may be carried out using known industrial process, such as processes utilized in the quilting insulation fabrication industries.

In some embodiments, a conductive thread or yarn can be combined with non-conductive threads or yarns to form a patterned, flexible substrate comprising the conductive component. For example, a thread or yarn can be woven directly into a fabric during formation of the fabric rather than being added to a previously formed fabric or other substrate.

Conductive inks useful for printing or otherwise applying to a surface of a flexible substrate can include any material in a liquid state adapted for deposition and including electrically conductive components. For example, suitable conductive inks can comprise a carrier and conductive particles, such as nano-to-micro sized metallic particles. The carrier may be formed of or otherwise include a binder configured to maintain the conductive particles in the deposited pattern. The binder particularly can be configured to provide for flexibility of the deposited conductive ink after drying. The process by which the conductive ink is deposited can vary based on the carrier viscosity. In exemplary embodiments ink jet printing can be used for low viscosity inks, and screen printing can be used for more viscous inks. Preferably, the overall conductive ink composition applied to the flexible substrate exhibits a resistance that is sufficiently close to the resistance of the bulk conductive component. For example, the resistance of the conductive ink can be no more 2 orders of magnitude or no more than one order of magnitude greater than the resistance of the bulk conductive component (e.g., the bulk metal particles).

Useful conductive elements can be selected in some embodiments based upon their Seebeck coefficient values. A flexible TE device can include a first electrically conductive component and a second electrically conductive component, the electrically conductive components having Seebeck coefficients of opposite sign. Metals can have either a positive or negative Seebeck coefficient based on how effectively phonons scatter electron transport. In metals where electrons are not strongly scattered, the higher velocity of hot-side electrons causes the electrons to diffuse to the cold side, thus generating a negative Seebeck coefficient. In metals where phonon scattering of electronic transport increases sufficiently with temperature to limit mean free path, electron diffusion occurs from the cold side to the hot side and the Seebeck coefficient in positive. Non-limiting examples of metals with positive Seebeck coefficients that may be useful in forming a flexible TE device according to the present disclosure include the following (with the Seebeck coefficient in $\mu V/°$ C.): silver (1.51), copper (1.83), gold (1.94), molybdenum (5.6), titanium (9.1), iron (15), chromium (21.8), Chromel (90Ni/10Cr) (22), Nichrome (80Ni/20Cr) (25), and Tellurium (500). Non-limiting examples of metals with negative Seebeck coefficients that may be useful in forming a flexible TE device according to the present disclosure include the following (with the Seebeck coefficient in $\mu V/°$ C.): tin (−1.0), lead (−1.05) aluminum (−1.66), manganese (−9.8), palladium (−10.7), scandium (−19), nickel (−19.5), cobalt (−30.8), Constantan (55Cu/45Ni) (−39), and bismuth (−72). A flexible TE device can comprise a first electrically conductive component and a second conductive component with respective Seebeck coefficients that are sufficiently different to provide the desired TE generation. For example, in some embodiments, the Seebeck coefficient of the second electrically conductive component can differ from the Seebeck coefficient of the first electrically conductive component by at least 25, by at least 50, by at least 75, or by at least 100. Thus, the Seebeck coefficient of the electrically conductive components can be both positive or can be both positive. Alternatively the Seebeck coefficient of one electrically conductive component can be positive and the Seebeck coefficient of the other electrically conductive component can be negative.

A flexible TE device according to the present disclosure can comprise a plurality of junctions of two electrically conductive components of opposite sign. In some embodiments, the two electrically conductive components can be connected electrically in series and thermally in parallel, as illustrated in FIG. 3. The present TE devices particularly can comprise a plurality of thermopiles, wherein a single thermopile comprises back-to-back junctions of the first and second electrically conductive components. In particular, the first junction in a thermopile can be positioned at the hot side of the TE device, and the second junction in a thermopile can be positioned at the cold side of the TE device. Thus, the present TE device can comprise a plurality of thermopiles connected electrically in series. In some embodiments, each junction can have a resistance of about 0.001 to about 0.1 Ohms.

The flexible TE devices can be configured to achieve a define temperature gradient relative to the source of the low grade heat. For example, when applied to a 200° C. heat source, the flexible TE device can achieve a temperature gradient of about 100° C. to about 175° C. In various embodiments, the temperature gradient across the flexible TE device can be about 50% to about 90% of the temperature of the heat source.

Flexible TE devices according to the present disclosure can provide many advantages of known TE technologies while also providing the ability for high volume, low cost production. In some embodiments, a flexible TE device can be configured to substantially mimic known insulation technologies, thus providing for seamless integration into industrial settings where insulation is already utilized to reduce heat loss. The present flexible TE devices are thus adaptable to both high and low volume facilities with both continuous and non-continuous heat flows.

Exemplary embodiments of flexible TE devices according to the present disclosure and their use in converting waste heat to electrical energy are illustrated in FIGS. 4a through 4e. Specifically, FIG. 4a illustrates the application of a flexible TE device for recovering low temperature heat from cooling water in a steam turbine condenser wherein the flexible TE device is wrapped around an inlet pipe for hot water into the condenser. FIG. 4b shows a cut-away illustration of the pipe with the flexible TE device wrapped therearound and includes a cross-sectional that is illustrated in three exemplary embodiments in FIGS. 4c-4e.

Although FIG. 4a exemplifies recovering waste heat from industrial equipment, the present disclosure is not limited to such uses. Any source of low grade heat can be a source of heat for recovery. Specifically, the heat source can be any source at a temperature greater than ambient and up to about 300° C., up to about 250° C., or up to about 200° C. In some embodiments, the low grade heat source can comprise organic sources, including mammals, such as humans. For example, a flexible TE device according to the present disclosure can be an article of clothing. In such embodiments, the flexible TE clothing can be configured to produce electricity safely in amounts sufficient to power medical devices, sensors, and the like and/or charge external electrical devices (e.g., mobile phones or similar devices).

In the embodiment of FIG. 4c, a first metallic yarn and a second metallic yarn having differing Seebeck coefficients as described herein are stitched onto a flexible substrate (fabric) in a pattern forming a series of thermopile junctions. As illustrated, a plurality of stitched flexible substrates are combined with electrically insulating spacers to form the overall flexible TE device. If desired, an insulating layer may be included around one or both of the inner edges and the outer edges of the layered substrates thus forming opposing faces in thermal connection with the heated pipe (inner edges) and the cooler atmosphere (outer edges). In the embodiment of FIG. 4d, a first conductive ink and a second conductive ink having differing Seebeck coefficients are deposited on the surface of a flexible substrate (fabric) that is shaped such that alternating junctions of the formed thermopiles are positioned adjacent the heat source and the intervening junctions of the formed thermopiles are positioned in the cooler, surrounding atmosphere. The flexible substrate may be molded into the exemplified shape or may be pleated. A variety of shapes may be utilized, and the exemplified star-type pattern is non-limiting. A plurality of flexible TE devices may be combined, as illustrated. In the embodiment of FIG. 4e, a binary conductive thread is stitched through a flexible substrate so as to form alternating thermopile junctions at a first surface that is positioned adjacent the heat source and at a second, opposing surface in the cooler, surrounding atmosphere.

The flexible TE device can be provided in a variety of shapes and sizes and can be customized to the shape and size of the respective material to which it is to be applied. In some embodiments (See FIG. 4c and FIG. 4d) the flexible TE device can be configured as an elongated strip that is greater in length than in width. In some embodiments, the flexible TE device can be configured as a tape and may include an adhesive or other attachment element if desired. Such elongated strips or tapes can be wrapped around the heat source, for example, in a spiral fashion.

EXPERIMENTAL

The present invention will now be described with specific reference to the following example, which are not intended to be limiting of the invention and are rather provided to show exemplary embodiments.

A flexible TE device was prepared using a non-woven nylon substrate. Nickel and copper conductive lines were screen-printed onto the substrate in a zigzagged pattern to form a series of thermopile junctions. The conceptual design of the test and the formed test pattern are illustrated in FIG. 5a and FIG. 5b, respectively. The so-made flexible TE device was formed of 12 thermopiles with a total of 24 junctions.

The formed TE device was heated on one side with a hot-plate while the opposite end was held at 0° C. with an ice water bath. The test device had a line resistance of 220Ω and generated approximately 9 mV at a ΔT of approximately 150° C. This equates to a maximum power of approximately 0.4 µW. The voltage output was also observed to be linear with the temperature gradient, as expected for a thermopile device (see the graph of FIG. 6).

Many modifications and other embodiments of the disclosure will come to mind to one skilled in the art to which this disclosure pertains having the benefit of the teachings presented in the foregoing descriptions and the associated drawings. Therefore, it is to be understood that the disclosure is not to be limited to the specific embodiments disclosed herein and that modifications and other embodiments are intended to be included within the scope of the appended claims. Although specific terms are employed herein, they are used in a generic and descriptive sense only and not for purposes of limitation.

The invention claimed is:

1. A flexible thermoelectric device comprising:
a flexible substrate having a surface;
a first conductive ink having a Seebeck coefficient; and
a second conductive ink having a Seebeck coefficient that is different from the Seebeck coefficient of the first conductive ink;
wherein each of the first conductive ink and the second conductive ink independently comprises a carrier and conductive particles;
wherein each of the first conductive ink and the second conductive ink independently has a resistance that is no more than two orders of magnitude greater than the resistance of the conductive particles alone;
wherein the first conductive ink and the second conductive ink are arranged on the surface of the flexible substrate so as to form a series of thermopile junctions; and
wherein the flexible substrate is shaped such that alternating thermopile junctions are positioned so as to be spaced apart from intervening thermopile junctions.

2. The flexible thermoelectric device according to claim 1, wherein the flexible substrate is formed of a fibrous material.

3. The flexible thermoelectric device according to claim 2, wherein the flexible substrate is a woven fabric or a non-woven fabric.

4. The flexible thermoelectric device according to claim 2, wherein the flexible substrate comprises a material selected from the group consisting of polyesters, cotton, polyamides, poly-N-vinylcarbazole, cellulosic materials, polyvinyl alcohol, polypropylene, polyethylene terephthalate, fiberglass, and combinations thereof.

5. The flexible thermoelectric device according to claim 1, wherein the flexible substrate is a pre-molded substrate.

6. The flexible thermoelectric device according to claim 1, wherein the flexible substrate is folded proximate each of the thermopile junctions.

7. The flexible thermoelectric device according to claim 1, wherein the first conductive ink has a positive or negative Seebeck coefficient and the second conductive ink has a Seebeck coefficient of opposing sign.

8. The flexible thermoelectric device according to claim 1, wherein the conductive particles are nano-to-micro sized metallic particles.

9. A method of forming a thermoelectric device comprising:
providing a flexible substrate having a surface; and
applying a first conductive ink and a second conductive ink to the surface of the flexible substrate such the first conductive ink and the second conductive ink are arranged on the surface of the flexible substrate so as to form a series of thermopile junctions, the first conductive having a Seebeck coefficient, and the second conductive ink having a Seebeck coefficient that is different from the Seebeck coefficient of the first conductive ink;

wherein after said applying, the flexible substrate is in a shape such that alternating thermopile junctions are positioned so as to be spaced apart from intervening thermopile junctions;

wherein each of the first conductive ink and the second conductive ink independently comprises a carrier and conductive particles; and wherein each of the first conductive ink and the second conductive ink independently has a resistance that is no more than two orders of magnitude greater than the resistance of the conductive particles alone.

10. The method according to claim 9, wherein after said applying, the flexible substrate is in a pleated shape.

11. The method according to claim 9, further comprising folding the flexible substrate, before or after said applying, so that the flexible substrate is in a pleated shape.

12. The method according to claim 9, wherein the flexible substrate is formed of a fibrous material.

13. The method according to claim 12, wherein the flexible substrate is a woven fabric or a non-woven fabric.

14. The method according to claim 12, wherein the flexible substrate comprises a material selected from the group consisting of polyesters, cotton, polyamides, poly-N-vinylcarbazole, cellulosic materials, polyvinyl alcohol, polypropylene, polyethylene terephthalate, fiberglass, and combinations thereof.

15. The method according to claim 9, wherein the first conductive ink has a positive or negative Seebeck coefficient and the second conductive ink has a Seebeck coefficient of opposing sign.

16. The method according to claim 9, wherein the conductive particles are nano-to-micro sized metallic particles.

* * * * *